United States Patent [19]
Larsson

[11] Patent Number: 5,917,869
[45] Date of Patent: Jun. 29, 1999

[54] APPARATUS AND METHOD FOR TIMING/ CARRIER RECOVERY IN BANDWIDTH-EFFICIENT COMMUNICATIONS SYSTEMS

[75] Inventor: Patrik Larsson, Ocean Township, Monmouth County, N.J.

[73] Assignee: Lucent Technologies Inc., Murray Hill, N.J.

[21] Appl. No.: 08/723,731

[22] Filed: Sep. 30, 1996

[51] Int. Cl.[6] .................................................. H04L 7/00
[52] U.S. Cl. ........................................ 375/355; 375/326
[58] Field of Search .................................. 375/326, 327, 375/232, 355, 377

[56] References Cited

U.S. PATENT DOCUMENTS

| | | |
|---|---|---|
| 4,694,469 | 9/1987 | Kaku et al. ............................ 375/231 |
| 4,805,191 | 2/1989 | Burch et al. ............................ 375/229 |
| 5,103,464 | 4/1992 | Capkun et al. ......................... 375/354 |
| 5,559,840 | 9/1996 | Melas et al. ............................ 375/355 |
| 5,668,831 | 9/1997 | Claydon et al. ........................ 375/232 |

*Primary Examiner*—Temesghen Ghebretinsae

[57] ABSTRACT

A method and circuit for timing and carrier recovery of a digital signal in broadband communications systems. The digital signal is sampled at a given rate and a first k number of successive samples are stored in a local memory bank. The next m-k samples are then ignored. The stored samples are then processed such that the timing and carrier are recovered therefrom within m clock cycles. In one method for processing the stored k samples, the samples are filtered and locked so that the timing and carrier can be recovered therefrom.

15 Claims, 6 Drawing Sheets

VCXO CONTROL VOLTAGE

PHASE DEVIATION VCXO-XMIT CLK (ns)

JITTER HISTOGRAM (ps)

VCXO CONTROL VOLTAGE

PHASE DEVIATION VCXO-XMIT CLK (ns)

JITTER HISTOGRAM (ps)

APPARATUS AND METHOD FOR TIMING/CARRIER RECOVERY IN BANDWIDTH-EFFICIENT COMMUNICATIONS SYSTEMS

FIELD OF THE INVENTION

The present invention relates to broadband communications systems, and more particularly to timing and carrier recovery in communications systems.

BACKGROUND OF THE INVENTION

As the demand for higher bit rates in communications systems continues, high-speed signaling schemes are becoming more desirable. Present day standards (e.g. FCC standards) and the physical properties of present day transmission media (e.g. cable attenuation), however, act to limit the available bandwidth in present day systems. As a result, present day systems have adopted bandwidth-efficient line codes to provide broad-band communications.

The term "line code" refers to the waveform pattern of voltage or current used to represent the 1's and 0's of a digital signal on a transmission link. For example, a unipolar line code may be used to transmit the 1's by transmitting a positive voltage and the 0's by transmitting a zero voltage over the communications link. The form of the wave generated by the line code directly affects the bandwidth required to communicate the 1's and 0's over the communications link. As a result, a bandwidth-efficient line code that provides low excess bandwidth is desirable for today's high bit rate communications.

One concern with communications involving such bandwidth-efficient line codes is timing/carrier recovery. That is, the recovery of the clock synchronization at the receiver. A major factor in making such clock recovery at the receiver is the modulation format used to communicate over a bandwidth limited channel. More specifically, it is a concern that modulation formats that provide high bandwidth efficiency through line codes with low excess bandwidth tend to complicate the clock recovery at the receiver, and thus require more advanced signal processing to recover the timing information. An in-depth discussion of this concept can be found in publications such as, Franks, "Carrier and Bit Synchronization in Data Communication - A Tutorial Review," *IEEE Transactions on Communications*, Vol. 28, No. 8, pp. 1107–1121, August 1980.

Traditionally, timing and carrier recovery is performed through analog circuits. Recently, however, there has been an emphasis on providing digital implementations of such timing and carrier recovery circuits. There are several reasons for the emphasis on the digital implementations. They include: (1) digital circuits eliminate the need for analog circuit tuning; (2) digital circuits eliminate the problems associated with the drift and aging of analog circuits; (3) digital integrated circuits are generally insensitive to process variations, and power supply and temperature variations; (4) digital circuits simplify programmability, and (5) it is relatively easy to convert a digital circuit to different integrated circuit process technologies.

Systems employing bandwidth-efficient codes or signals having low excess bandwidth, however, require extensive filtering to recover the transmitter clock at the receiver. Moreover, when housing a digital clock recovery system in an integrated circuit (IC), additional transistors are required to perform the extra filtering function. As a result, in present-day systems that provide bandwidth-efficient line codes with low excess bandwidth, digital clock recovery systems require a large IC area, and thus increased IC power consumption.

Presently, there are several schemes for clock recovery in such communications systems. One of the simplest signaling schemes for which a clock recovery method has been developed is Non-Return-to-Zero (NRZ) data transmission. Although NRZ transmissions require very simple hardware (i.e. low IC area and low power consumption), they provide high excess bandwidth and low bandwidth efficiency, and thus are undesirable for some of today's high bit rate requirements.

There are, however, several modulation schemes that provide higher bandwidth efficiencies. They include Phase Amplitude Modulation (PAM), Quadrature Amplitude Modulation (QAM), and Quadrature Phase Key Shifting (QPSK). These schemes, however, require complex circuitry, and thus large IC area and high power consumption.

For example, squaring circuits, such as those illustrated in FIG. 1 have been previously used in the art. As shown in FIG. 1, a modulated input signal is input into the squaring circuit, which is then passed through a bandpass filter and a phase locked loop, that generates the clock. Such circuits are well known and are found in such publications as Lee, *Digital Communications*, Kluwer, 1994. This squaring function has been replaced by other nonlinear functions, such as an absolute value or a power-4 circuit. This method utilizes the cyclostationary property of the incoming signal to derive a clock signal. At sufficiently high signal-to-noise ratio (SNR) and excess bandwidth, the phase locked loop can be replaced by a sign function which translates the output of the bandpass filter to a square wave.

An example of the output of a prior art squaring function is shown in FIGS. 2a and 2b. The power spectrum of a Carrierless Amplitude Modulation (CAP)-16 signal with 100% excess bandwidth is shown in FIG. 2a. The Cap-16 is a 16 point constellation modulation scheme that is very similar to the more well known QAM. The spectrum of the squared signal, shown in FIG. 2b, indicates a clear peak at the symbol rate, 12.96 MHz, which can be further filtered through the bandpass filter and a phase locked loop to get a stable clock with low jitter. The spectral efficiency of this CAP-16 signal is derived as 51.84 Mb/s/25 MHz$\approx$2 B/s/Hz.

Another CAP standard, CAP-64, is based on a 155.52 Mbps Physical Media Dependent layer, The CAP-64 standard calls for Carrierless Amplitude Modulation/Phase Modulation with a 64-point constellation and is analogous to CAP-16 above. A system employing CAP-64 may produce an excess bandwidth of 15%. The power spectrum of a system employing the CAP-64 scheme is shown in FIG. 3a. As shown, such a system provides a spectral efficiency of 155.52 Mb/s/30 MHz$\approx$5 b/s/Hz.

Squaring the signal gives the spectrum as shown in FIG. 3b. As shown, squaring results in a significant degradation in the peak as compared to FIG. 2b. As those skilled in the art will recognize, this degradation is caused by the reduced excess bandwidth. The energy of this peak, however, is so low that the locking of the phase locked loop becomes unreliable.

An approach to enhance the peak shown in FIG. 3b is to use a different nonlinearity than the square function. Absolute value and power-4 functions have been shown to give a larger peak. However, in a digital implementation, this requires a higher oversampling ratio to avoid aliasing, which severely limits its applicability to broad-band systems.

One proposed solution to derive a more reliable clock for digital standards is the band-edge timing recovery method described in Lee, supra. In the Lee method, only energy in the band edges of the original signal contributes to the peak at the symbol rate. By removing energy from the center of the passband spectrum, the peak-to-noise ratio is increased. This method is shown in FIGS. 4a and 4b. As shown in FIG. 4b, the signal, the spectrum of which is shown in FIG. 4a, is applied to two bandpass filters, BP1 and BP2, with the characteristics shown in FIG. 4a. The output of the bandpass filters are multiplied and further filtered through a third bandpass filter, BP3, which is tuned to the expected symbol rate, and then through a phase locked loop. The spectrum at the output of the multiplier is shown in FIG. 5a and at the output of the third bandpass filter in FIG. 5b. As shown, the peak at symbol rate is significantly enhanced, as compared to that shown in FIG. 3b, and the phase locked loop locks reliably onto to this peak.

A digital prior art implementation of the block diagram shown in FIG. 4b is shown in FIG. 6a. This implementation is similar to that described in Godard, "Passband Timing Recovery in an All-Digital Modem Receiver," *IEEE Transactions on Communications*, vol. 26, no. 5, pp. 517–523, May 1978. As shown, all digital blocks are clocked with the same clock as the analog to digital (A/D) converter, i.e. N samples are taken during a symbol interval. From the A/D converter, the signal is passed through two parallel bandpass filters, a multiplier, and through a third bandpass filter similar to the circuit shown in FIG. 4b. The decimator and the Sgn block represent a phase detector and a charge pump in a conventional phase-locked loop. This method is well suited for a communication receiver based on a fractionally spaced equalizer with fractional spacing N, for example N=4 or N=3. Each bandpass filter in FIG. 6a can be implemented as a second order IIR filter with two multipliers, as shown in FIG. 6b. The total hardware required for this circuitry, however, includes 7 multipliers and 8 adders all running at the sample rate, which equals N times the symbol rate. This obviously constitutes considerable power consumption and area in an integrated circuit.

One solution for reducing the hardware is to use a single multiplier and adder and, then, clock these at 8 times the sample rate of the A/D converter. Although this would allow time sharing of the hardware, and thus save IC area, it would not save any power consumption. Moreover, this solution is of limited practical use in broadband systems, where the A/D sampling rate might be as high as 50–75 MHz.

Therefore, there still exists a need in the art to provide a low power, and area efficient method and circuit for timing and carrier recovery for broadband, digital communication (in particular modem applications) systems. The present invention addresses this need.

SUMMARY OF THE INVENTION

Accordingly, one object of the present invention is to provide a low power, area efficient system (both method and apparatus) for timing and carrier recovery in broadband, digital communication systems.

Another object of the present invention is to provide such a system which can be easily transitioned across different integrated circuitry technologies.

In an illustrative embodiment of the present invention, these and other objects of the invention are accomplished by storing k number of input samples in a local memory bank after converting the signal in a A/D converter; ignoring the next m-k samples, wherein the total available time to process the first k samples consists of m clock cycles; and then processing the stored input samples through parallel bandpass filters coupled to a single multiplier and an adder. These samples may then be fed back through various registers, which are manipulated by a controller or processed through to a phased lock loop to recover the clock.

By using this illustrative method and apparatus of storing k samples and ignoring the next m-k input samples while processing the previous k samples, a single sample is processed with a single multiplier and adder, as opposed to the 7 multipliers required in the above-described prior art circuitry. In other words, if m>7 k, it is possible to implement the necessary filtering for digital applications with a single multiplier.

For example and as will be shown in the Detailed Description of the Invention, for the situation where k=24 and m=312, the timing/carrier recovery can be accomplished with a single multiplier and adder with a comfortable margin of control circuits. Moreover, the phased lock loop also locks for larger values of m and k, as compared to prior art devices. Further, when the m/k ratio is 312/24, or 13, the hardware required by the present invention is reduced by approximately a factor of 7 (that is, the 7 multipliers required by prior art methods such as shown in FIG. 6a are reduced to a single multiplier) and the power consumption is reduced by a factor of approximately 10 (leaving some overhead of the control circuit needed for the present invention).

BRIEF DESCRIPTION OF THE DRAWING

These and other features of the invention will be better understood in light of the following Detailed Description of the Invention and the attached Figure wherein:

FIG. 2b is a power spectrum of the squared signal of the signal in FIG. 2a;

FIG. 3b is a power spectrum of the squared signal of the signal in FIG. 3a;

FIGS. 8d–f show the control voltage of the VCO at the receiver, the phase offset between the transmit clock and the recovered receive clock, and the phase jitter on the recovered clock, respectively, according to the prior art circuit shown in FIG. 6a.

DETAILED DESCRIPTION OF THE INVENTION

Figure 7:
FIG. 7 illustrates the selective signal sampling of an illustrative embodiment of the present invention.

To reduce the area and power compared to the prior art architectures, it is advantageous to reduce the amount of computation. According to an illustrative embodiment of the present invention, this amount of computation is reduced by providing a circuit wherein it is not necessary to process every input sample provided to the circuit in order to recover the clock. This is accomplished by a circuit that first stores k number of input samples in a local memory bank after converting the input signal in an analog to digital (A/D) converter. This is shown on the time line of FIG. 7. The next m-k clock cycles are used to process the previous k samples. During this time, the output samples of the A/D converter are ignored as far as the clock recovery circuit is concerned.

At time t=m*T, where T is the sample period, the process repeats itself by storing another k samples (mT≦t≦(m+k)T), which are processed during the time period (m+k)T≦t≦2 mT. Of course, the processing and storage can be run in parallel such that during the time period mT≦t≦(m+k)T, samples are stored and some of the samples are processed. The rest of the samples are processed during the time period (m+k)T≦t≦2 mT.

Figure 6A:
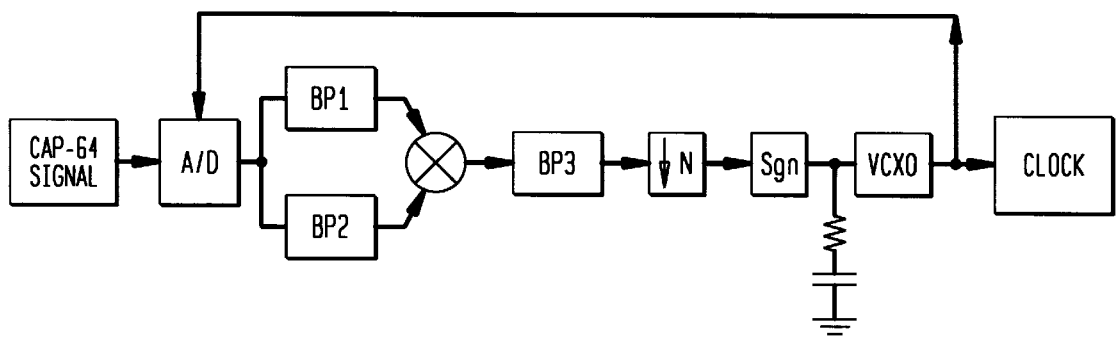
FIG. 6a is a block diagram of a digitally implemented band-edge timing recovery circuit used in the prior art.
Figure 6B:
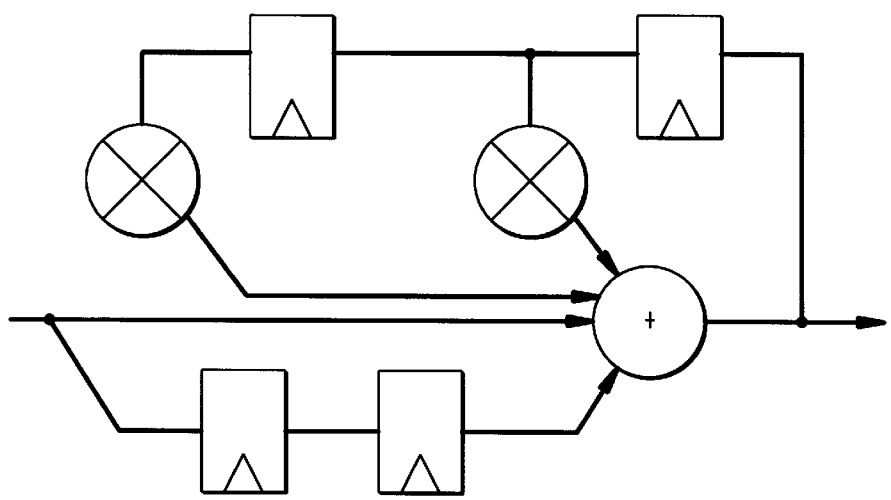
FIG. 6b is a detail block diagram for each bandpass filter in FIG. 6a which can be implemented as a second order IIR filter.

The stored samples may be processed using a portion of the clock recovery structure described in relation to FIGS. 6a and 6b, i.e. using the parallel bandpass filters to a multiplier and then through a third bandpass filter. With these circuits, there will be enough total available time to process the first k samples in the m clock cycles. Using the circuit of FIG. 6a and 6b, a single sample must pass through 7 multipliers. However, if m>7 k, it is possible to implement the necessary filtering for digital applications according to an illustrative embodiment of the present invention with a single multiplier, thus reducing the total hardware.

Figure 9:
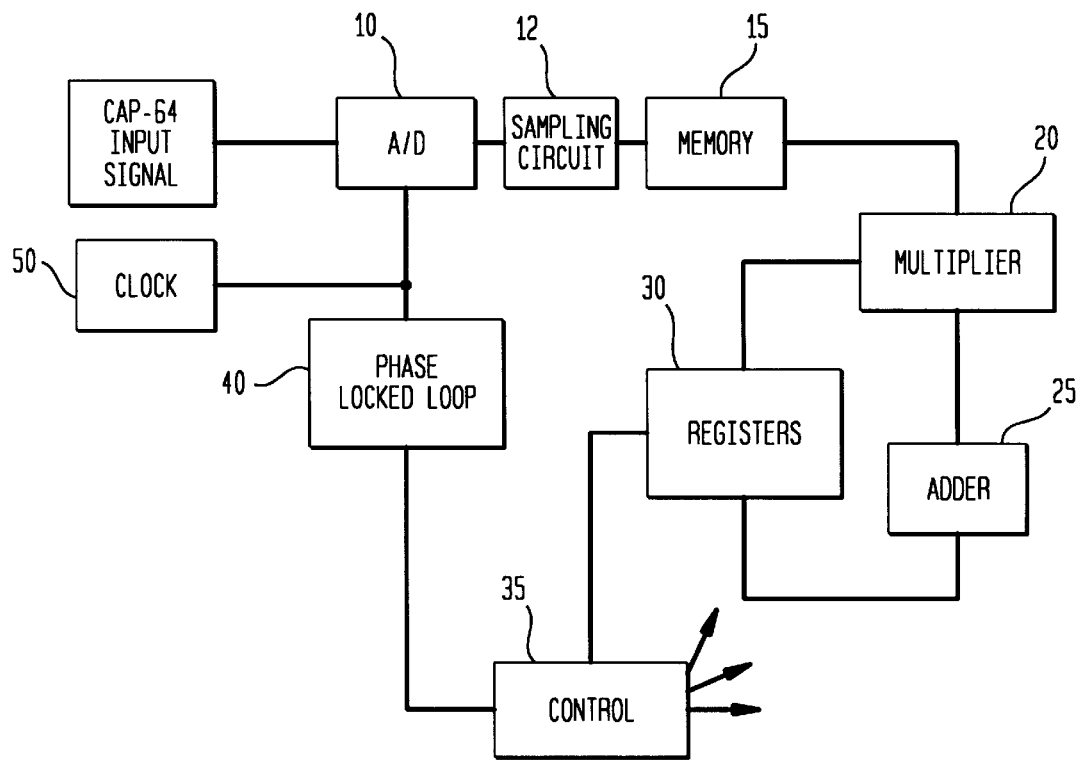
FIG. 9 is a block circuit diagram of an illustrative embodiment of the present invention.

Referring now to FIG. 9, there is shown a block diagram of the timing and carrier recovery circuit according to an illustrative embodiment of the present invention. As shown, a k number of input signal samples, for example, a series of samples of a CAP-64 signal, are processed through an analog-to-digital (A/D) converter 10, sampling 12, and stored in a memory bank 15. The processing that is done by the bandpass filters in FIG. 4b can now be implemented by a single (or a few) multiplier 20 and an adder 25. Intermediate results can be stored in registers 30, and all subblocks can be controlled by controller 35. The controller also detects the sign of the output sample and sends appropriate signals to the phase locked loop 40 similar to the decimator/sgn circuit in FIG. 6a. The output of the phase locked loop 40 is recovered signal which is provided to the processor clock 50.

Figure 8A:
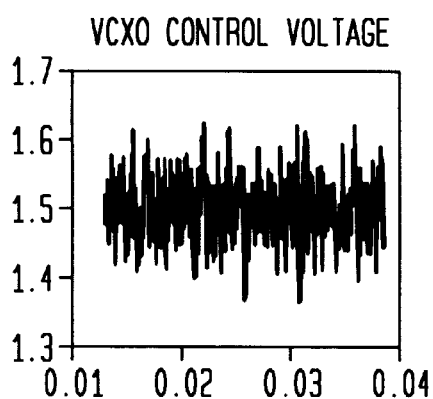
FIGS. 8a–c show the control voltage of the VCO at the receiver, the phase offset between the transmit clock and the recovered receive clock, and the phase jitter on the recovered clock, respectively, according to an illustrative embodiment of the present invention.
Figure 8B:
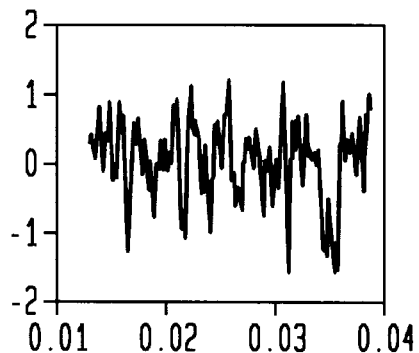
Figure 8C:
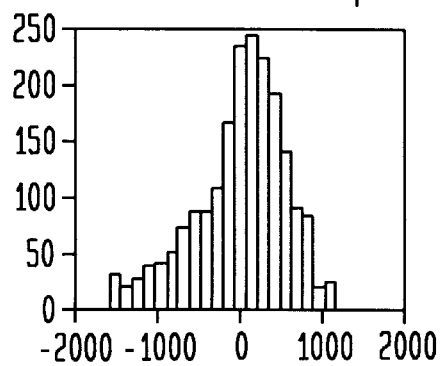
Figure 8D:
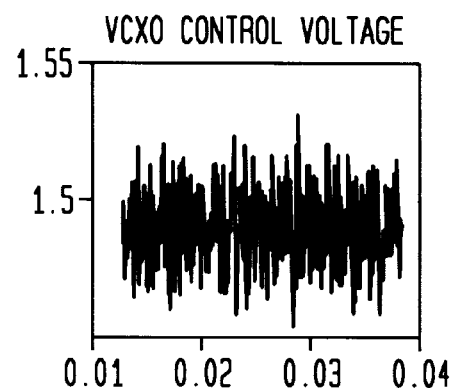
Figure 8E:
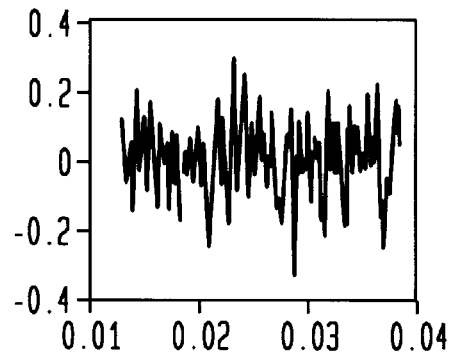
Figure 8F:
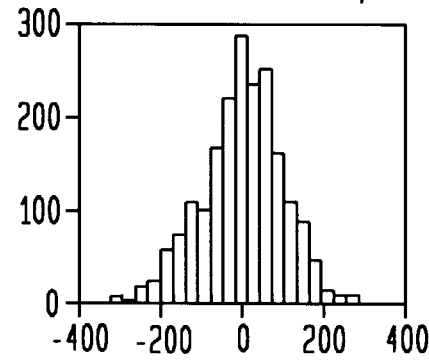

For example, assuming k=24 and m=312, the graphs of FIGS. 8a–c show that the present invention is a successful clock recovery system without having to process every signal. FIGS. 8a–c illustrate the Voltage Control Crystal Oscillator (VCXO) control voltage at the receiver; the phase shift offset between the transmit clock and the recovered receive clock; and the phase jitter on the recovered clock, respectively. Those skilled in the art will readily recognize that when the output data of the present invention, presented in FIGS. 8a–c, is compared to same output data from prior art devices, as shown in FIGS. 8d–f, the present invention exhibits an acceptable performance for k=24 and m=312.

By using this method and apparatus of storing k samples and ignoring the next m-k input samples while processing the previous k samples, the samples are processed with a single multiplier and adder, as opposed to the 7 multipliers used in prior art circuitry. For example, for the case where k=24 and m=312, the timing/carrier recovery can be accomplished with a single multiplier and adder with only a small number of control circuits, such as the register and controller. Moreover, the phased lock loop will also lock for larger values of m and k. Of course, for these larger values, the jitter may be increased with increasing m and decreasing k, but the power consumption will still be smaller than with prior art methods. Moreover, when the m/k ratio is 312/24 or 13, the hardware required by the present invention is reduced by approximately a factor of 7 (that is the 7 multipliers required by prior art methods such as shown in FIG. 6a are reduced to a single multiplier) and the power consumption is reduced by a factor of approximately 10 (leaving some overhead of the control circuit needed for the present invention).

Accordingly, the present invention leads to several advantages over existing timing and carrier recovery circuits: 1) an apparatus in accordance with the present invention can be implemented with much less circuit space, due to the decrease in the number of multipliers and adders; 2) an apparatus in accordance with the present invention only requires a fraction of the power consumption necessary for existing devices, that is, power savings between 90% and 80% are predicted with use of the present invention; 3) an apparatus in accordance with the present invention is highly programmable, in that it is possible to use the same macroblock for various system requirements and a single modem can handle many "physical layers."

Figure 1:
FIG. 1 is a prior art squaring circuit to derive a clock signal.
Figure 4A:
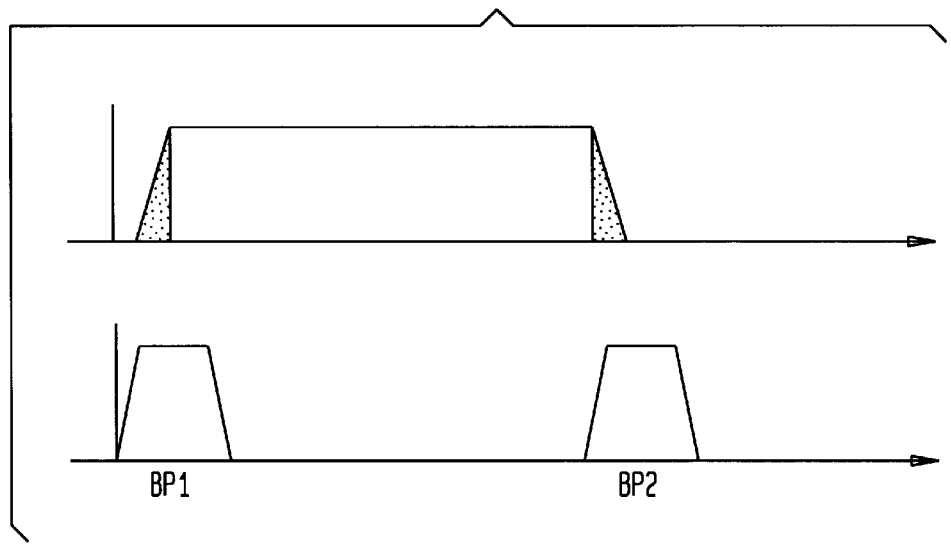
FIG. 4a graphically represents the removal of the center part of the spectrum of a input signal to enhance the peak at the symbol rate for prior art devices.
Figure 4B:
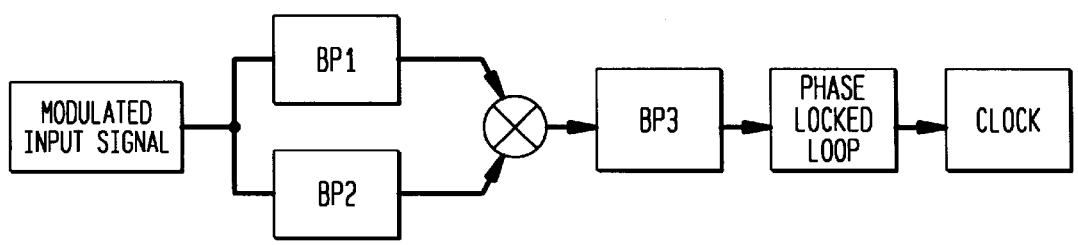
FIG. 4b is a block diagram illustrating the circuitry used in prior art devices to recover the clock.
Figure 2A:
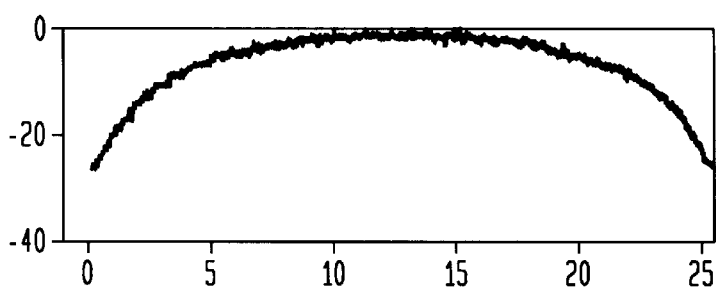
FIG. 2a is a power spectrum of a CAP-16 signal with 100% excess bandwidth.
Figure 2B:
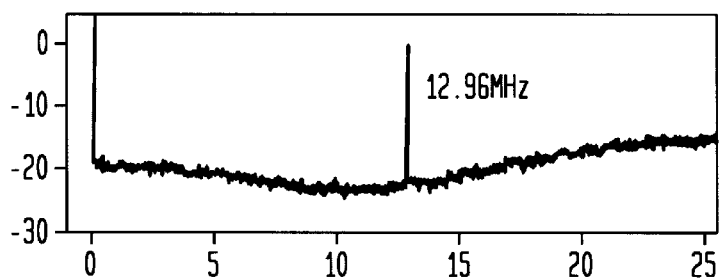
Figure 3A:
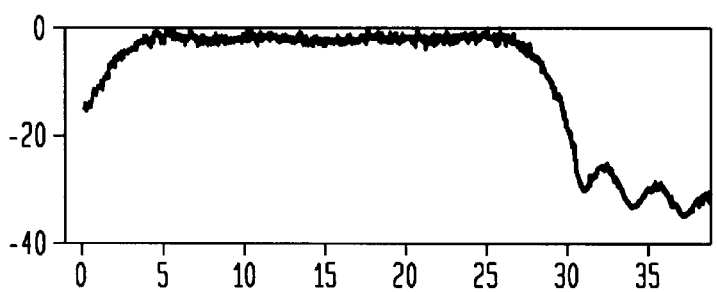
FIG. 3a is a power spectrum of a CAP-64 signal with 15% excess bandwidth.
Figure 3B:
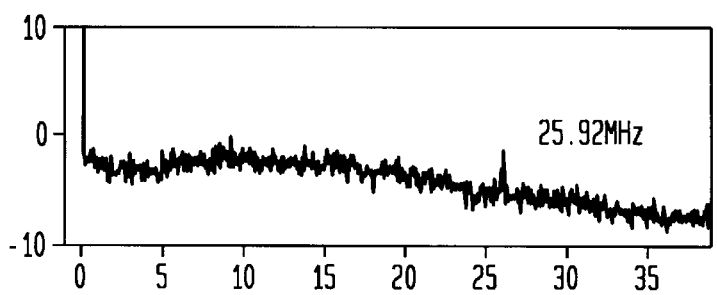
Figure 5A:
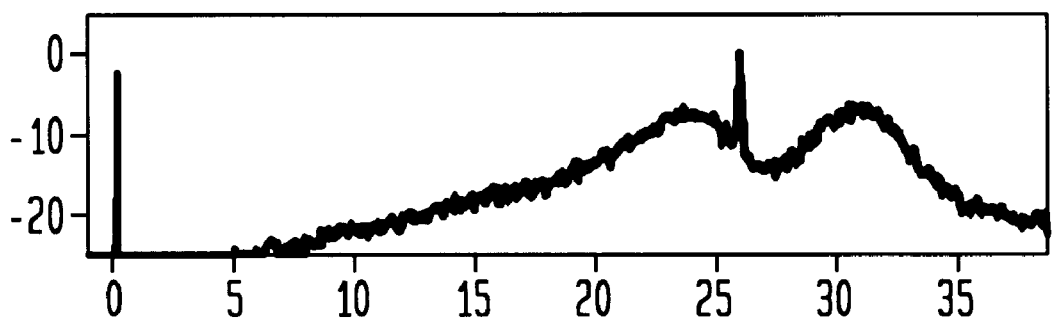
FIG. 5a is a power spectrum at the output of the multiplier of the circuit shown in FIG. 4b.
Figure 5B:
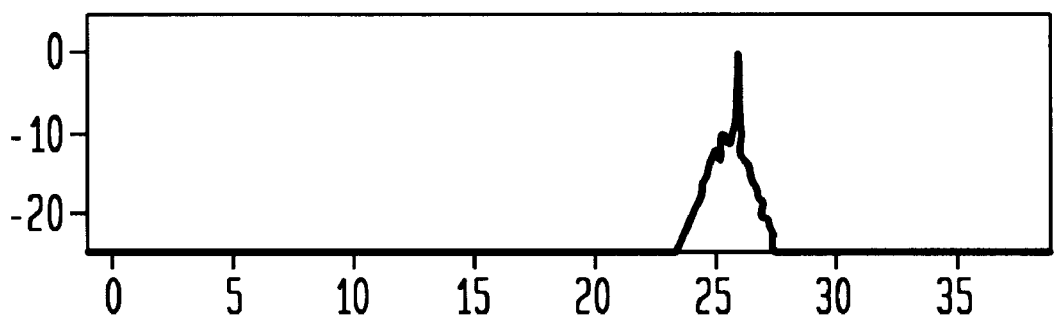
FIG. 5b is a power spectrum at the output of the third bandpass filter of the circuit shown in FIG. 4b.

From the above, it will be apparent to those skilled in the art that the method of partial processing in accordance with the present invention and described herein is not strictly limited to the clock recovery scheme described in FIG. 4b. Various other types of signal processing can be performed by the processor in FIG. 9 and/or other embodiments of the present invention to recover the clock information.

What is claimed is:

1. A circuit for timing and carrier recovery of a digital signal in a broadband communication system, comprising:

a sampling circuit for sampling the digital signal at a given rate, said sampling circuit operable to sample a first k successive samples of the digital signal from a set of m successive samples of the digital signal wherein k is a first variable and m is a second variable such that k<m;

means for processing said first k successive samples in substantial absence of processing of the next m-k successive samples to recover said timing and carrier therefrom, wherein said k successive samples are processed within m clock cycles, said means for processing comprising a memory storage device for storing said k successive samples;

a signal filter coupled to said memory storage device for filtering said k successive samples, and means for locking said filtered samples to recover said timing and carrier signal therefrom.

2. The circuit for timing and carrier recovery of claim 1 further comprising means for providing a processor clock with the recovered timing and carrier signal.

3. The circuit for timing and carrier recovery of claim 1 wherein said signal filter coupled to said memory storage device for filtering said k successive samples comprises at least one adder coupled in series with a multiplier.

4. The circuit for timing and carrier recovery of claim 3 wherein said means for locking comprises a phase locked loop.

5. The circuit for timing and carrier recovery of claim 4 further comprising a feedback register operable to control any feedback to said multiplier.

6. A circuit for timing and carrier recovery of a digital signal in a broadband communication system, comprising:

a sampling circuit for sampling the digital signal at a given rate, wherein the digital signal is a signal obtained from converting through an analog to digital converter, an analog signal selected from the group consisting of phase modulated signals and amplitude modulated signals, said sampling circuit operable to sample a first k successive samples of the digital signal from a set of m successive samples of the digital signal wherein k is a first variable and m is a second variable such that k<m;

means for processing said first k successive samples in substantial absence of processing of the next m-k successive samples to recover said timing and carrier therefrom, wherein said k successive samples are processed within m clock cycles.

7. A circuit for timing and carrier recovery of of a digital signal in a broadband communication system, comprising:

a sampling circuit for sampling the digital signal at a given rate, wherein the digital signal is a signal obtained from converting through an analog to digital converter, an analog signal selected from the group consisting of CAP-64, CAP-128, CAP-256, CAP-16, CAP-25, CAP-36, QAM-16, and QAM-32, said sampling circuit operable to sample a first k successive samples of the digital signal from a set of m successive samples of the digital signal wherein k is a first variable and m is a second variable such that k<m;

means for processing said first k successive samples in substantial absence of processing of the next m-k successive samples to recover said timing and carrier therefrom, wherein said k successive samples are processed within m clock cycles.

8. A method for timing and carrier recovery of a digital signal in a broadband communications system, the method comprising the steps of:

sampling the digital signal at a given rate;

storing a first k successive digital signal samples from a set of m successive samples of the digital signal in a memory circuit, wherein k is a first variable and m is a second variable such that k<m;

processing said first k successive samples in substantial absence of processing of the next m-k successive samples to obtain the timing and carrier recovery therefrom, wherein said processing is performed within m clock cycles and wherein said step of processing said k successive samples comprises the steps of accessing said stored first k successive samples, filtering the stored k successive samples, and locking the filtered samples to recover the timing and carrier signal therefrom.

9. The method for timing and carrier recovery of claim 8 further comprising the step of providing a processor clock with the recovered timing and carrier signal.

10. The method for timing and carrier recovery of claim 8 wherein the locking step is accomplished by a phased locked loop.

11. The method for timing and carrier recovery of claim 10 further comprising the step of communicating an output of a feedback register to a means for accomplishing said locking step.

12. The method for timing and carrier recovery of claim 11 wherein the digital signal is a signal obtained from converting an analog signal through an analog to digital converter.

13. The method for timing and carrier recovery of claim 12 wherein said analog signal is selected from the group consisting of phase modulated signals and amplitude modulated signals.

14. The method for timing and carrier recover of claim 13 wherein said analog signal is selected from the group consisting of CAP-64, CAP-128, CAP-256, CAP-16, CAP-25, CAP-36, QAM-16, and QAM-32.

15. A method for timing and carrier recovery of a digital signal in a broadband communications system, the method comprising the steps of:

sampling the digital signal at a given rate, wherein the digital signal is a signal obtained from converting through an analog to digital converter, an analog signal selected from the group consisting of phase modulated signals and amplitude modulated signals;

storing a first k successive digital signal samples from a set of m successive samples of the digital signal in a memory circuit;

processing said first k successive samples in substantial absence of the processing of next m-k successive samples to obtain the timing and carrier recovery therefrom, wherein said processing is performed within m clock cycles.

* * * * *